United States Patent
Kagami

(10) Patent No.: US 8,098,412 B2
(45) Date of Patent: Jan. 17, 2012

(54) METHOD FOR DETECTING THE CENTER OF WAFER AND STORAGE MEDIUM STORING A PROGRAM FOR EXECUTING THE METHOD

(75) Inventor: Fumito Kagami, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 1134 days.

(21) Appl. No.: 11/857,790

(22) Filed: Sep. 19, 2007

(65) Prior Publication Data

US 2008/0068618 A1 Mar. 20, 2008

(30) Foreign Application Priority Data

Sep. 19, 2006 (JP) .................................. 2006-253062

(51) Int. Cl.
*G01B 11/14* (2006.01)

(52) U.S. Cl. ........ 358/501; 382/151; 382/288; 382/287; 356/620; 702/150; 700/245; 358/448; 250/559.3; 250/559.29

(58) Field of Classification Search .................. 382/151, 382/288, 287; 356/620; 702/150; 700/245; 358/448, 502, 501; 250/559.3, 559.29
See application file for complete search history.

(56) References Cited

U.S. PATENT DOCUMENTS

| | | | | | |
|---|---|---|---|---|---|
| 4,887,904 | A | * | 12/1989 | Nakazato et al. | 356/621 |
| 5,381,004 | A | * | 1/1995 | Uritsky et al. | 250/307 |
| 5,555,091 | A | * | 9/1996 | Kagamida | 356/635 |
| 6,400,445 | B2 | * | 6/2002 | Nishi et al. | 355/72 |
| 6,439,969 | B1 | * | 8/2002 | Koma et al. | 451/41 |
| 6,677,602 | B1 | * | 1/2004 | Norton | 250/559.3 |
| 7,229,845 | B1 | * | 6/2007 | Luu et al. | 438/16 |
| 7,280,200 | B2 | * | 10/2007 | Plemmons et al. | 356/237.3 |
| 7,487,064 | B2 | * | 2/2009 | Lim | 702/179 |
| 2005/0013476 | A1 | | 1/2005 | Simpkins | |
| 2006/0222236 | A1 | * | 10/2006 | Osada et al. | 382/151 |

FOREIGN PATENT DOCUMENTS

| JP | 2002-151575 | 5/2002 |
|---|---|---|
| JP | 2002-280287 | 9/2002 |

OTHER PUBLICATIONS

Office Action issue May 17, 2011 in Japanese Patent Application No. 2006-253062 (with English translation).

* cited by examiner

*Primary Examiner* — Twyler Haskins
*Assistant Examiner* — Dennis Dicker
(74) *Attorney, Agent, or Firm* — Oblon, Spivak, McClelland, Maier & Neustadt, L.L.P.

(57) ABSTRACT

A method detects a center of a wafer having a notch when aligning the wafer mounted on a movable mounting table. The method includes capturing an image of the wafer by using an imaging unit, the image including the notch; extracting an edge line from the image of the wafer; detecting a shape of the notch from the edge line; and calculating the center of the wafer based on the shape of the notch.

10 Claims, 8 Drawing Sheets

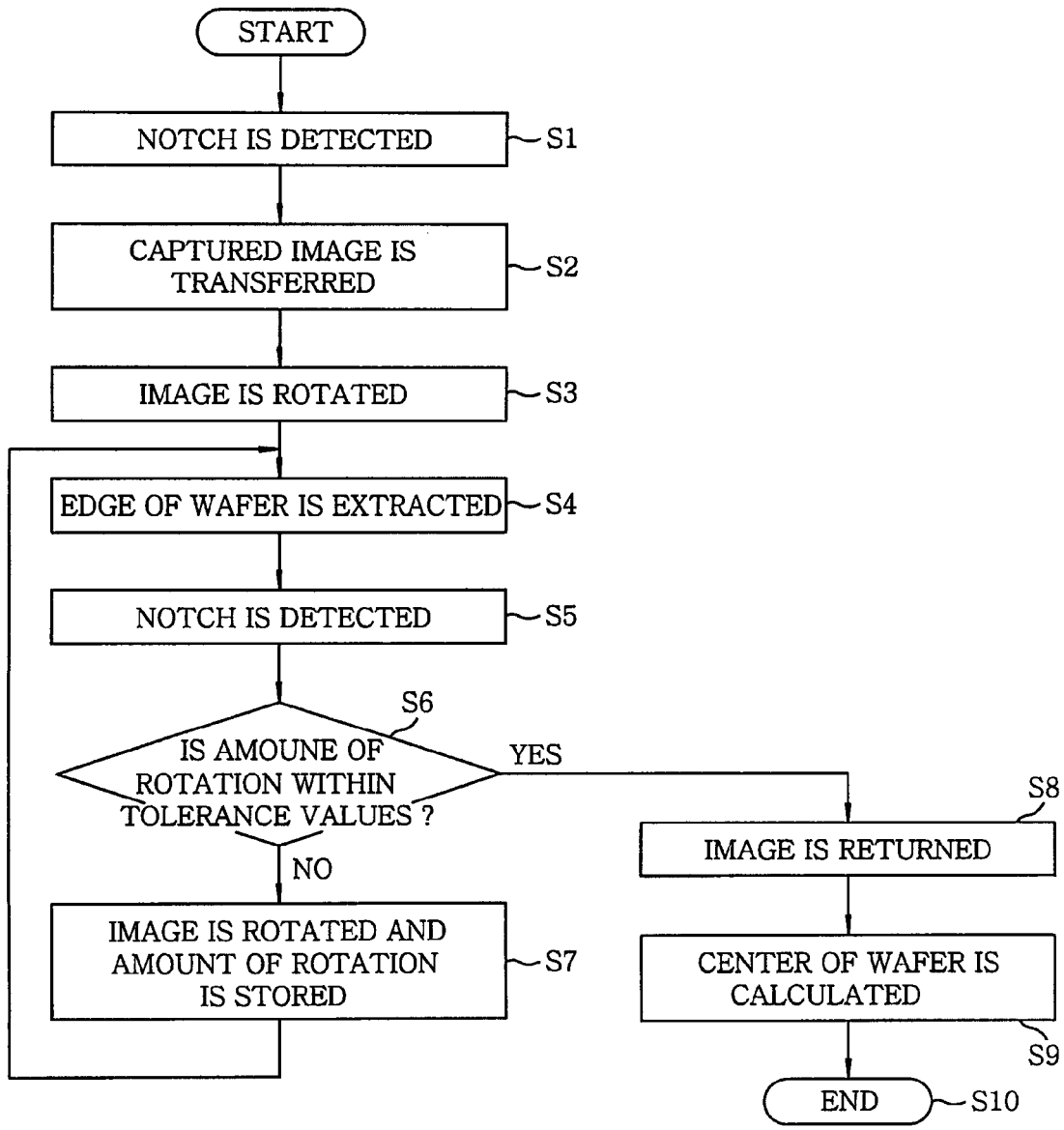

METHOD FOR DETECTING THE CENTER OF WAFER AND STORAGE MEDIUM STORING A PROGRAM FOR EXECUTING THE METHOD

FIELD OF THE INVENTION

The present invention relates to a method for detecting the center of a wafer to position or align the wafer before performing various processings on the wafer mounted on a mounting table, and a storage medium storing a program for executing the method.

BACKGROUND OF THE INVENTION

A process for manufacturing semiconductor devices from a wafer includes various processing steps, and each of the processing steps is performed on the wafer mounted on a mounting table. An alignment operation for precisely positioning the wafer is often performed prior to a specific processing step to be performed on the wafer.

In case a wafer is inspected by an inspection apparatus shown in FIG. 5 for example, the alignment between a plurality of test electrodes of each device of the wafer and probes corresponding thereto is performed before the inspection is carried out by allowing electrical contact between the test electrodes and the corresponding probes. As illustrated in FIGS. 5A and 5B, the inspection apparatus includes a loader chamber 1 for loading and unloading of a wafer W; and a prober chamber 2 for inspecting electrical characteristics of the wafer W. The loader chamber 1 has a transfer arm 3 for transferring a wafer W in a cassette C to the prober chamber 2; and a pre-alignment mechanism 4 for performing a pre-alignment of the wafer W while the wafer W is being transferred by the transfer arm 3.

The prober chamber 2 has a mounting table 5 for mounting thereon the pre-aligned wafer W, the mounting table 5 being movable in X, Y, Z and θ directions; a probe card 6 disposed above the mounting table 5; and an alignment mechanism 7 for performing an alignment between a plurality of probes 6A of the probe card 6 and the wafer W on the mounting table 5. Further, the probe card 6 is fixed at an opening of a head plate 8. A test head 9 is provided on top of the head plate 8, and the probe cared 6 is electrically connected with a tester (not illustrated) via the test head 9.

The pre-alignment mechanism 4 has a rotatable table 4A for mounting thereon the wafer W; and an optical detection unit (not shown) for optically detecting notches formed around an outer periphery of the wafer W. While the rotatable table 4A having thereon the wafer W is rotating, the optical detection unit detects the notches of the wafer W, thereby pre-aligning the wafer in a specific direction. As for a pre-alignment mechanism of the kind described above, there is known a wafer pre-alignment mechanism described in Japanese Patent Laid-open Application No. H10-012709.

As depicted in FIGS. 6A and 6B, the alignment mechanism 7 has a first CCD camera 7A for capturing images of the wafer W; a second CCD camera 7B, attached to the side of the mounting table 5, for capturing images of the probes 6A; and an alignment bridge 7C for supporting the first CCD camera 7A; and a pair of guide rails 7D for guiding the alignment bridge 7C to a probe center. The first CCD camera 7A captures the images of the test electrodes of the wafer W, and the second CCD camera 7B captures the images of the probes 6A. Next, the test electrodes and the probes 6A are aligned based on the image position data.

Prior to the alignment of the wafer W, a size and a center of the wafer W are detected by using the first CCD camera 7A. That is, while the mounting table 5 is translationally moving under the first CCD camera 7A, an image of the wafer W is captured and processed, thereby recognizing three points on the circumference of the wafer W as points P1, P2 and P3, as shown in FIG. 7. Next, a line segments P1P2 and P2P3 are obtained by a computer and, then, an intersection point of the perpendicular bisectors of the respective line segments is calculated as the center C of the wafer W.

However, in a conventional method of detecting the center C of the wafer W, the mounting table 5 needs to be moved so that the circumferential portion of the wafer W can cross an optical axis of the first CCD camera 7A in order to allow the three points P1, P2 and P3 of the wafer W to be recognized by the first CCD camera 7A. As a consequence, a moving amount of the mounting table 5 increases, and a long period of time is required to detect the three points, which hinders the reduction of time for aligning the wafer W.

SUMMARY OF THE INVENTION

In view of the above, the present invention provides a method for detecting the center of a wafer, which is capable of shortening wafer alignment time by reducing a moving amount of a mounting table, and a storing medium storing a program for executing the method.

In accordance with the present invention, there is provided a method for detecting a center of a wafer having a notch when aligning the wafer mounted on a movable mounting table, including: capturing an image of the wafer by using an imaging unit, the image including the notch; extracting an edge line from the image of the wafer; detecting a shape of the notch from the edge line; and calculating the center of the wafer based on the shape of the notch.

Preferably, the method further includes rotating the image so that the notch is positioned in a specific direction.

Preferably, the detecting the shape of the notch includes: detecting a start point and an end point of the notch based on slopes of tangents of the edge line; and calculating a vertex of the notch by performing a function approximation on the shape of the notch.

Preferably, the detecting the notch shape includes: calculating a first inclined angle of line connecting the start point and the vertex; calculating a second inclined angle of a line connecting the end point and the vertex; and calculating a third inclined angle of a line connecting the start point and the end point.

Preferably, the method further includes determining whether the absolute value of a sum of the first and the second inclined angle and the third inclined angle are respectively within threshold values.

Preferably, a threshold valve for the absolute value of the sum of the first and the second inclined angle is smaller than or equal to about 0.1° and a threshold valve for the third inclined angle is substantially 0°.

Preferably, the method further includes rotating the image by a specific angle if at least one between the absolute value of the sum of the first and the second inclined angle and the third inclined angle is beyond the first and the second threshold value.

Preferably, the specific angle is about 0.1°.

Preferably, the specific angle is sequentially accumulated.

Preferably, the method further includes: if both of the absolute value of the sum of the first and the second inclined angle and the third inclined angle are within the first and the second threshold value, calculating as an edge position of the wafer, an intersection point between a straight line connecting the start point and the end point and a perpendicular line that is perpendicular to the straight line while crossing the vertex and calculating as the center of the wafer a position on the perpendicular line spaced from the edge position by a radius of the wafer.

In accordance with another aspect of the present invention, there is provided a computer-readable storage medium storing a program for driving a computer to detect a center of a wafer based on an image of the wafer displayed on a screen, the image being captured by an imaging unit when aligning the wafer mounted on a mounting table, wherein the computer is driven to implement the method for detecting the center of a wafer which is described above.

In accordance with the aspects of the present invention, it is possible to provide a method for detecting the center of a wafer, which is capable of shortening wafer alignment time by reducing a moving amount of a mounting table, and a storing medium storing a program for executing the method.

BRIEF DESCRIPTION OF THE DRAWINGS

The objects and features of the present invention will become apparent from the following description of embodiments, given in conjunction with the accompanying drawings, in which:

FIGS. 2A and 2B describe top views of a wafer captured by a first CCD camera shown in FIG. 1, wherein FIG. 2A depicts a portion captured by the first CCD camera, and FIG. 2B shows the center of the wafer detected by the method of the present invention;

FIG. 3 provides a flow chart showing an entire process of detecting the center of the wafer;

FIGS. 6A and 6B provide an example of the inspection apparatus, wherein FIG. 6A is a partially cutaway front view of the inspection apparatus and FIG. 6B offers a top view of the inside of the inspection apparatus.

DETAILED DESCRIPTION OF THE EMBODIMENT

Hereinafter, embodiments of the present invention will now be described with respect to FIGS. 1 to 5C which form a part hereof.

Figure 1:
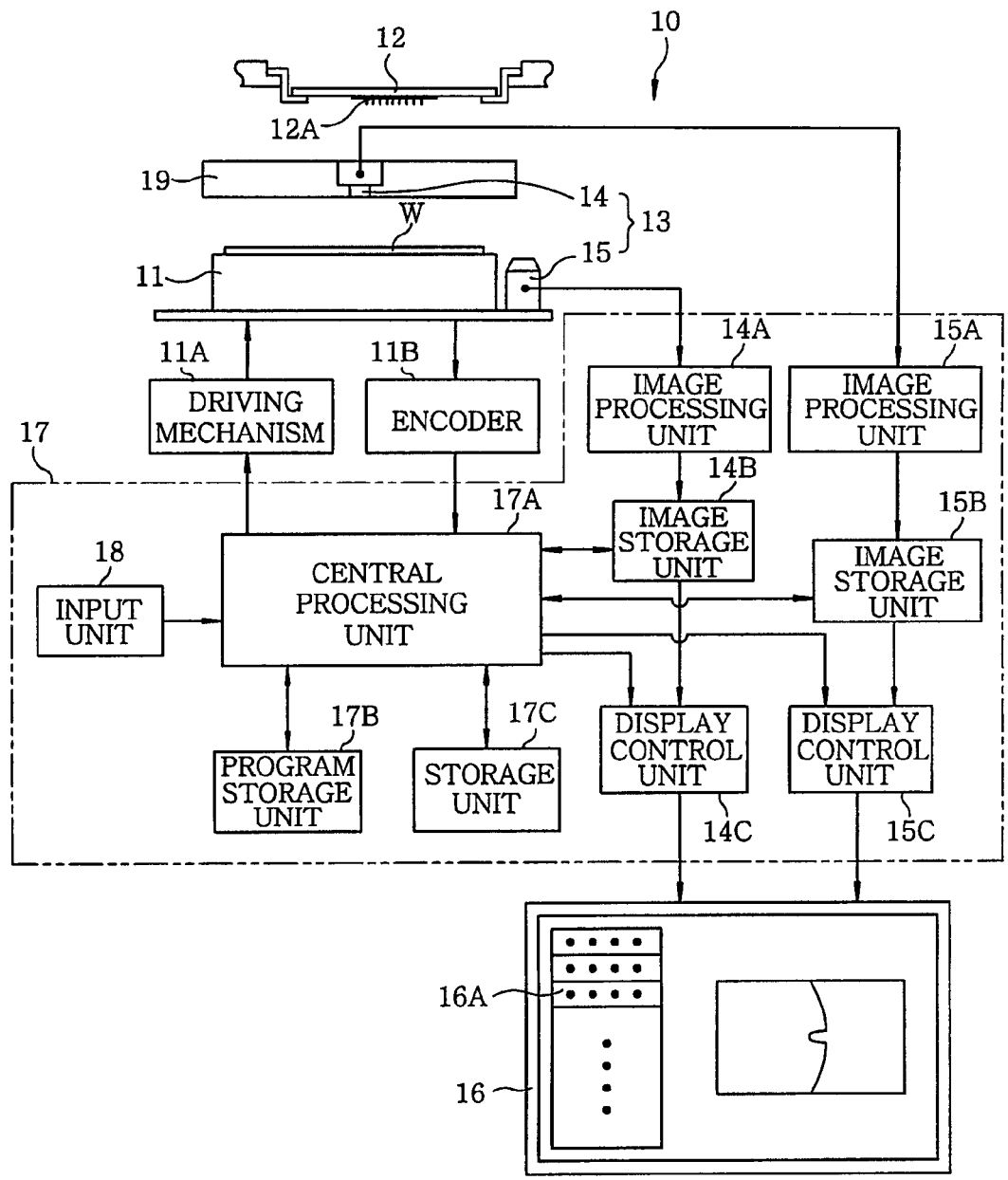
FIG. 1 is a block diagram showing a configuration of an inspection apparatus used for implementing a method which detects the center of a wafer in accordance with an embodiment of the present invention.

As illustrated in FIG. 1, an inspection apparatus 10 of an embodiment of the present invention includes a movable mounting table 11 for mounting thereon a wafer W serving as an object to be inspected and having a notch; a probe card 12 provided above the mounting table 11; an alignment mechanism 13 for performing an alignment between a plurality of probes 12A of the probe card 12 and the wafer W on the mounting table 11; a first and a second imaging units (e.g., a first and a second CCD camera 14 and 15) constituting the alignment mechanism 13; a display unit having a display screen 16 for displaying thereon images captured by the first and the second CCD camera 14 and 15; and a controller 17 formed of a computer for controlling the above described parts. The inspection apparatus is configured to inspect the electrical characteristics of the wafer W by electrically contacting the probes 12A and the wafer W after performing the alignment between the wafer W on the mounting table 11 and the probes 12A of the probe card 12 by using the alignment mechanism 13 under the control of the controller 17.

The inspection apparatus 10 further includes an input unit 18 such as a keyboard or the like, as shown in FIG. 1. The input unit 18 enables various inspection conditions to be inputted and also specifies a menu 16A or a micro computer (not shown) displayed on the display screen 16 so that various programs can be executed.

As shown in FIG. 1, the mounting table 11 has a driving mechanism 11A and a detector (e.g., an encoder 11B). The mounting table 11 is configured to move in X, Y, Z and θ directions via the driving mechanism 11A and detect a moving amount via the encoder 11B. The driving mechanism 11A has a horizontal driving mechanism (not shown) for driving an XY table on which the mounting table 11 is disposed, the horizontal driving mechanism being mainly formed of, e.g., a motor and a ball screw; an elevation driving mechanism installed inside the mounting table 11; and a θ driving mechanism for rotating the mounting table 11 in a θ direction. The encoder 11B detects moving distances of the XY table in X and Y directions by the number of revolutions of the motor and transmits the detected signals to the controller 17. The controller 17 controls the driving mechanism 11A based on the signals from the encoder 11B, thereby controlling the moving amount of the mounting table 11 in X and Y directions.

As described above, the alignment mechanism 13 has the first and the second CCD camera 14 and 15 and the alignment bridge 19. As illustrated in FIG. 1, the first CCD camera 14 is installed at the alignment bridge 19, and the second CCD camera 15 is installed at the side of the mounting table 11. The first and the second CCD camera 14 and 15 respectively capture images of the probes 12A and the wafer W at one of a low magnification and a high magnification.

The first CCD camera 14 moves from the rear part of the probe chamber to the probe center via the alignment bridge 19 and thus is positioned between the probe card 12 and the mounting table 11. While the mounting table 11 is moving in X and Y directions, the first CCD camera 14 positioned at the probe center captures, from the top, images of a portion of the wafer W in FIG. 2A, which a notch N is enclosed with rectangle, at a specific magnification and transmits the signals respectively the captured images to the controller 17. The captured wafer images are displayed on the display screen 16 via the controller 17.

Further, after the alignment bridge 19 moves to a rear part of the probe chamber, the second CCD camera 15 captures, from the below the probe card 12, images of a plurality of the probes 12A at a specific magnification while the mounting table 11 is moving in the X and Y directions under the probe card 12. The image signals are transmitted to the controller 17, so that the captured images of the probes are displayed on the display screen 16 via the controller 17.

The controller 17 has a central processing unit 17A; a program storage unit 17B for storing therein various programs including a program for executing a method for detecting the center of a wafer; a storage unit 17C for storing therein various data; image processing units 14A and 15A for processing the image signals from the first and the second CCD camera 14 and 15; image storage units 14B and 15B for storing therein as image data the image signals from the image processing units 14A and 15A; and display control units 14C and 15C for displaying the captured images on the display screen 16 based on the image signals. Signals are transmitted between the central processing unit 17A, the program storage unit 17B and the storage unit 17C, so that various parts of the inspection apparatus 10 can be controlled.

The central processing unit 17A is connected with the input unit 18. Therefore, various data signals inputted from the input unit 18 are processed by the central processing unit 17A and then stored in the storage unit 17C. In this embodiment, a program for executing a method for detecting the center of a wafer is stored in the program storage unit 17B and the program can be selectively executed from a menu 16A of the display screen 16. Further, the method may be displayed with icons instead of the menu.

Further, the central processing unit 17A is connected with the image storage units 14B and 15B and the display control units 14C and 15C. The images captured by the first and the second CCD camera 14 and 15 are displayed on the display screen 16 via the central processing unit 17A and the display control units 14C and 15C. The image storage units 14B and 15B can store therein previously captured images, synthetic images or the like in addition to the currently captured images from the first and the second CCD camera 14 and 15.

Programs for implementing the method of the present invention which detects the center of the wafer, and the like are stored in the program storage unit 17B via various storage mediums. However, these programs can be downloaded to various inspection apparatuses by communication media. In this embodiment, the program executed for implementing the method for detecting the center of the wafer is stored in the program storage unit 17B.

Hereinafter, a wafer center detecting method in accordance with an embodiment of the present invention will be described with reference to FIGS. 2 to 5C. After the wafer W is pre-aligned, the center of the wafer W is detected as a part of an alignment operation of the wafer W in an initial step thereof. When the center of the wafer W is detected, the amount of rotation of the wafer W is also obtained. The center of the wafer W is detected with an accuracy of less than about 50 μm in X and Y coordinates and about 0.1° in rotation angle. Further, the wafer W is pre-aligned with an accuracy of, e.g., about ±500 μm in the X and Y directions and, e.g., about ±1° in rotation angle of the notch.

First of all, when a program for executing the method for detecting the center of a wafer is selected on a menu 16A of the screen 16, the program is executed by the controller 17 according to the sequence shown in FIG. 3. Specifically, the wafer W that has been pre-aligned in advance in the loader chamber is mounted on the mounting table 11 of the prober chamber. Since the wafer W is pre-aligned, the wafer W can be mounted on the mounting table 11 in a state where the notch of the wafer W is positioned in a substantially identical direction. Then, the mounting table 11 is moved by the driving mechanism 11A under the first CCD camera 14 waiting at the probe center such that the notch N of the wafer W can be positioned on an optical axis of the first CCD camera 14. At that position, the first CCD camera 14 detects the notch N (step S1).

Figure 2A:
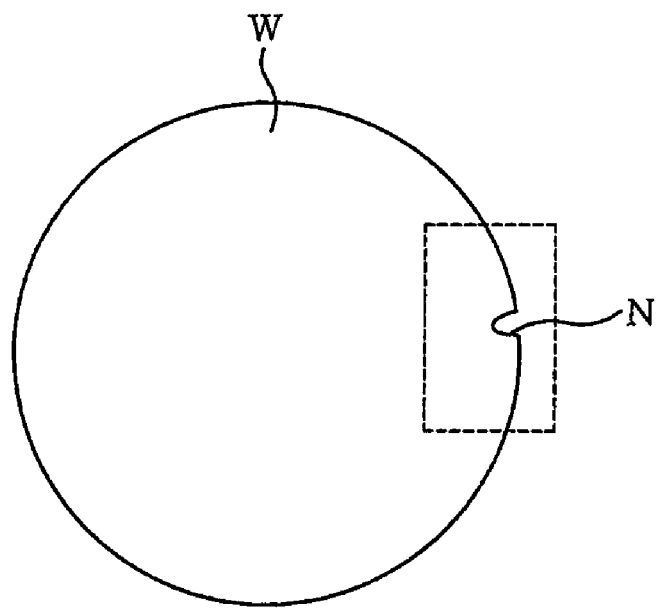
Figure 4A:
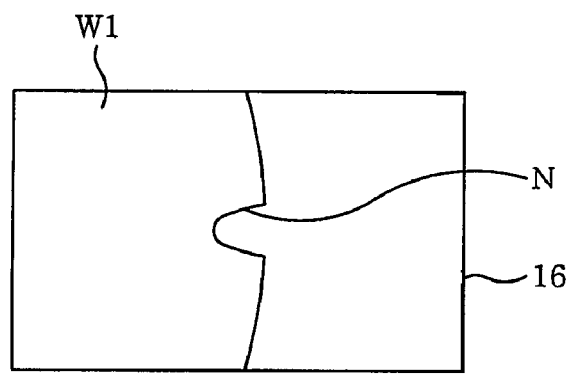
FIGS. 4A to 4C present main process views of sequential steps from an image capturing of the wafer to an extraction of an edge of the wafer.

Next, an image of the wafer W is captured such that the notch N is placed around the center of the image as shown in FIG. 2A, and the captured image is transferred to the controller 17 via the image processing unit 14A and the image storage unit 14B (step S2). The controller 17 displays a wafer image W1 on the screen 16 via the central processing unit 17A, as shown in FIGS. 1 and 4A. Referring to FIG. 1, there is illustrated the wafer image W1 that has rotated by 90° in the clockwise direction to be maintained in a horizontal state from a state where the notch N is positioned vertically with its bottom facing upwards. Since the wafer W on the mounting table 11 has been pre-aligned, the wafer image W1 can be further rotated by, e.g., 90°, 180° or 270° in the clockwise direction from the state of FIGS. 1 and 4A.

Figure 4B:
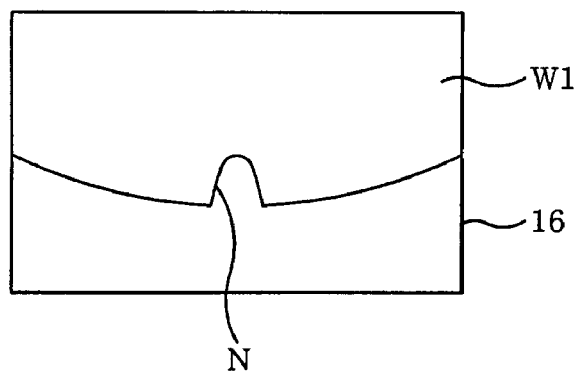

In this embodiment, in order to facilitate the detection of the center of the wafer W1, the wafer image W on the screen 16 is transformed from the state of FIG. 4A to the state of FIG. 4B by rotating the wafer image W1 about the center of the screen 16 by 90° in the clockwise direction, so that the notch N can be opened downwards vertically (step S3). At this time, if the direction of the notch N is in a state rotated from the state of FIG. 4A by 90° in the counterclockwise direction, the wafer image W1 is transformed to the state of FIG. 4B by rotating the wafer image W1 by 180° in the clockwise direction. Even if the wafer image W1 is aligned in any other direction, the wafer image W1 is always preferably transformed to the state of FIG. 4B.

Figure 4C:
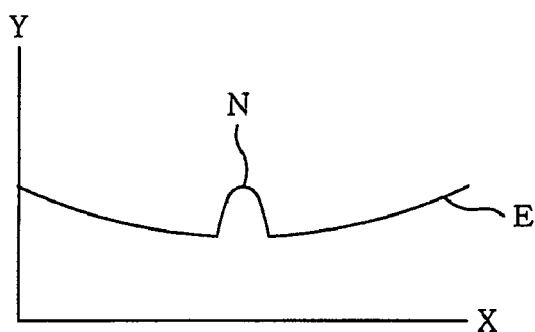

Thereafter, an edge line E is extracted from the wafer image W1 shown in FIG. 4B by using a caliper tool for example (step S4), and the edge line E of the wafer image W1 is represented in a graph of two-dimensional coordinates of X and Y, as illustrated in FIG. 4C. Here, the caliper tool has a function of extracting the edge line E and is used to automatically extract the edge line E of the wafer image W1 from the image of the wafer W1.

Next, the notch N is detected from the edge line E of the wafer image W1 by using the caliper tool (step S5). As can be seen from FIG. 5A, the process of detecting the notch N includes a process of detecting two transition points (start point and end point) of the notch N, a process of detecting a vertex of the notch N and a process of calculating an inclination of the notch N.

Figure 5A:
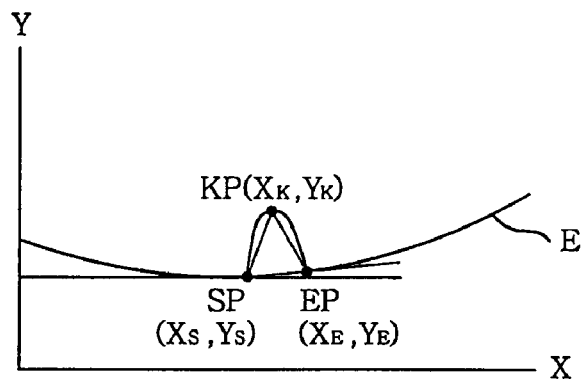
FIGS. 5A to 5C represent main process views of sequential steps from a detection of a notch of the wafer to a calculation of a center of an edge line of the notch.

In the process for detecting the transition points of the notch N, neighboring position data (pixel) on the edge line E of FIG. 5A is moved pixel by pixel in the positive X direction and, also, the difference in the position data of the Y direction is performed, thereby calculating displacement data $D_n(=Y_n-Y_{n+1})$. When a first point at which the displacement data $D_n$ is greater than or equal to a reference value, e.g., 10, is detected during the repetitive subtraction processes, the corresponding point is detected as a start point SP and, then, coordinates $(X_S, Y_S)$ of the start point SP are stored in the storage unit 17C.

Next, when a last point at which the displacement data $D_n$ is greater than or equal to 10 is detected during the repetitive subtraction processes in the positive X direction, the corresponding point is detected as the end point EP and, then, coordinates $(X_E, Y_E)$ of the end point EP are stored in the storage unit 17C. As set forth above, the subtraction between the neighboring position data enables the precise detection of the start point SP and the end point EP. In this example, the displacement reference value of the displacement data $D_n$ is set to 10 when detecting the start point SP and the end point EP. However, the reference value is not limited to 10 but may also be appropriately changed when necessary. The repetitive subtraction processes described above is identical to a process of calculating slopes of tangents of the edge line E and detecting the start point SP and the end point EP based thereon. The start point SP and the end point EP can be detected not by a magnitude of the slope but by a changing rate thereof.

In the process of detecting the vertex of the notch N, the quadratic function is calculated based on a plurality of position data on the curve of the notch N by using a least square method because the shape of the notch N is similar to a quadratic function, as depicted in FIG. 5A. Thereafter, a vertex of the quadratic function is calculated as coordinates $(X_K, Y_K)$ of the vertex KP of the notch N. At this time, it is not known whether the straight line crossing the center of the wafer W and the vertex of the notch N is perpendicular to the X-axis or not. If the straight line is not perpendicular thereto, the quadratic function needs to be calculated again. Accordingly, the inclination of the notch N of FIG. 5A is calculated.

In the process of calculating the inclination of the notch N, a slope $M_1=(Y_S-Y_K/X_S-X_K)$ of the straight line that connects the start point SP and the vertex KP of the notch N is calculated and, also, a slope $M_2=(Y_E-Y_K/X_E-X_K)$ of the straight line that connects the end point EP and the vertex KP is calculated, as illustrated in FIG. 5A. Thereafter, a slope $M_3=(Y_S-Y_E/X_S-X_E)$ of the straight line that connects the start point SP and the vertex KP is calculated. As a consequence, the detection of the notch N is completed.

Next, as described in the flowchart of FIG. 3, whether the rotated amount of wafer W placed on the mounting table 11 satisfies tolerance values or not is determined by the inclination of the notch N as follows (step S6). Specifically, there are two tolerance values for the rotated amount, i.e., $M_1+M_2<0.1°$ and $M_3\approx0$. Whether the rotated amount of the wafer W is proper or not is determined by whether or not the rotated amount satisfies the two tolerance values simultaneously. In the central processing unit 17A, it is determined whether both two tolerance values are simultaneously satisfied or not. If at least one of the two tolerance values is not satisfied as shown in FIG. 5A, the inclination is corrected by rotating the wafer image W1 about the center of the screen 16 in a clockwise θ direction by about 0.1°, and the amount of rotation of the wafer image W1, i.e., about 0.1°, is stored in the storage unit 17C (step S7). After the rotation of the wafer image W1, the steps S4 to S6 are repeatedly performed until the inclination of the notch N satisfies the two tolerance values; and the sum of the amounts of rotation, i.e., the total amount of rotation including the initial rotation amount, is sequentially stored in the storage unit 17C.

Figure 5B:
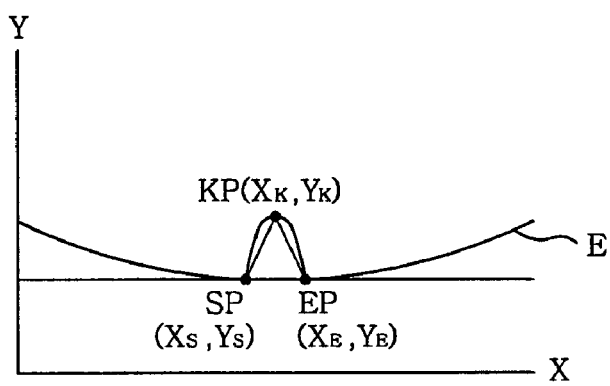
Figure 5C:
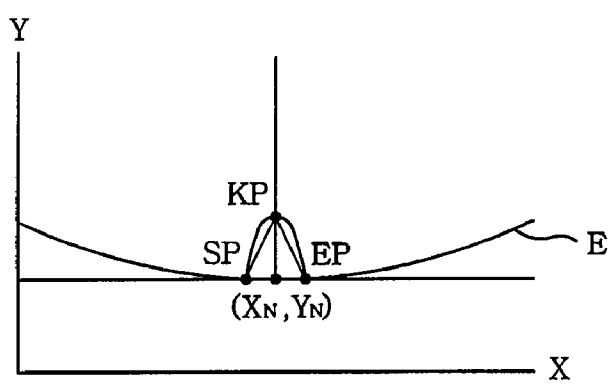
Figure 6A:
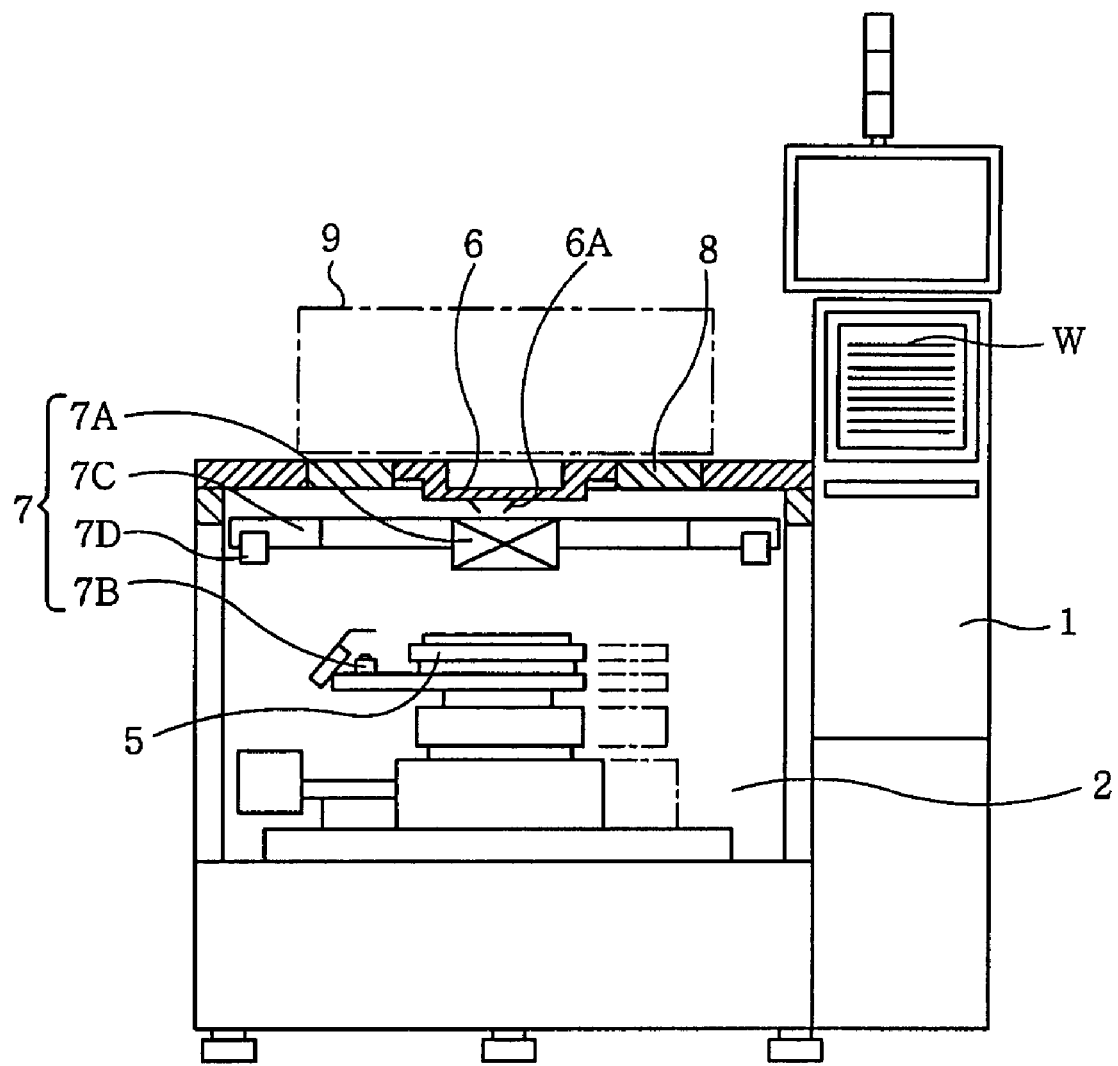
Figure 6B:
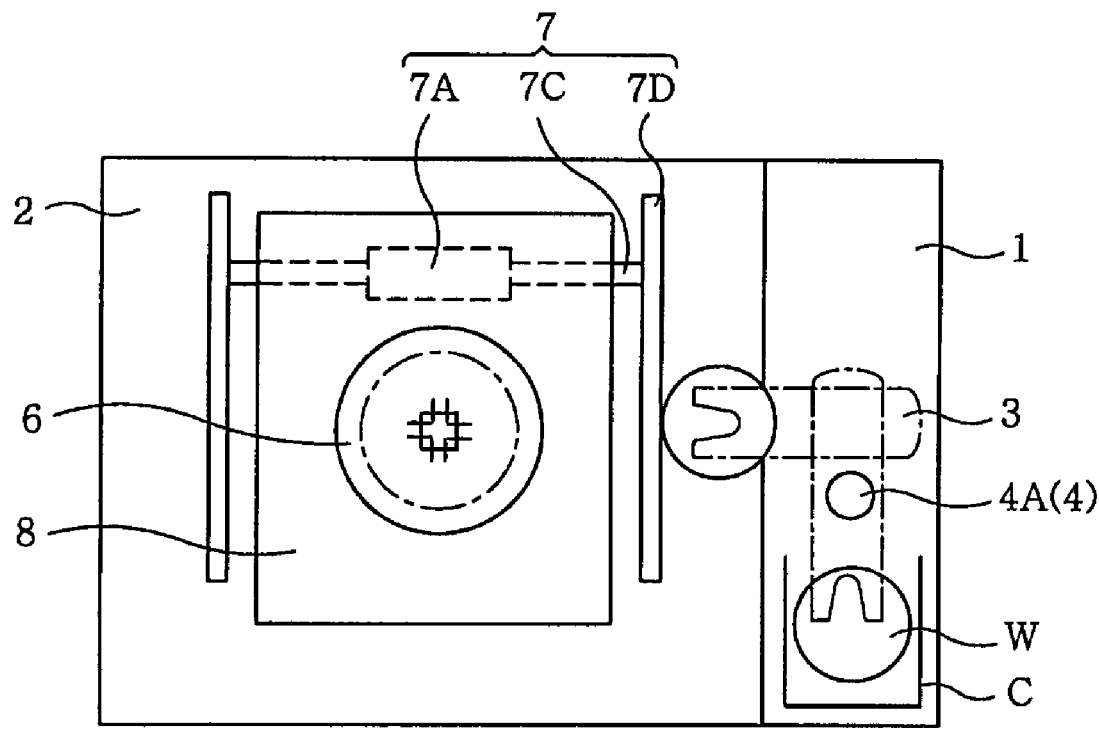
Figure 7:
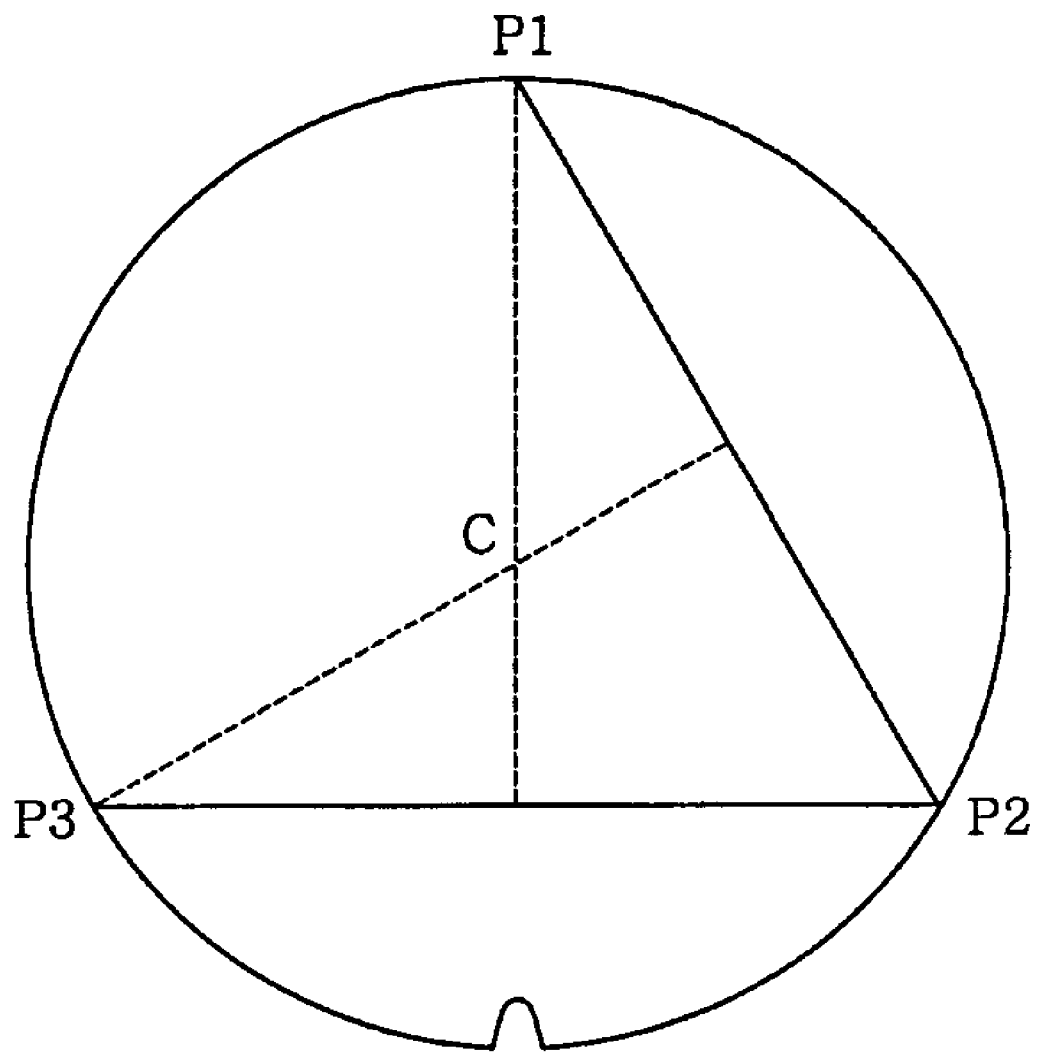
FIG. 7 illustrates an example of a conventional method for detecting the center of a wafer.

If it is determined in the step S6 of FIG. 3 that the inclination of the notch N satisfies the tolerance values as depicted in FIG. 5B, a perpendicular line passing the vertex KP is drawn to the straight line that connects the start point SP and the end point EP of the notch N; and an intersection point $(X_N, Y_N)$ of the straight line and the perpendicular line is calculated, as illustrated in FIG. 5C. The intersection point $X_N$ and $Y_N$ is recognized as one point on the edge line of the wafer W, and the coordinates thereof are stored in the storage unit 17C.

Next, the image is inverse-transformed to return to the captured image of FIG. 4A which was obtained before the image rotation of the step S3 (step S8). In that case, the total amount of rotation of the image accumulated in step S7 is reflected in restoring the original captured image (step S8). Therefore, the intersection point $X_N$ and $Y_N$ is transformed on the captured image according to the amount of rotation made until the intersection point $(X_N, Y_N)$ is calculated and is displayed on the screen as an intersection point $(X'_N, Y'_N)$ on the edge line of the wafer W, as can be seen from FIG. 2B.

Figure 2B:
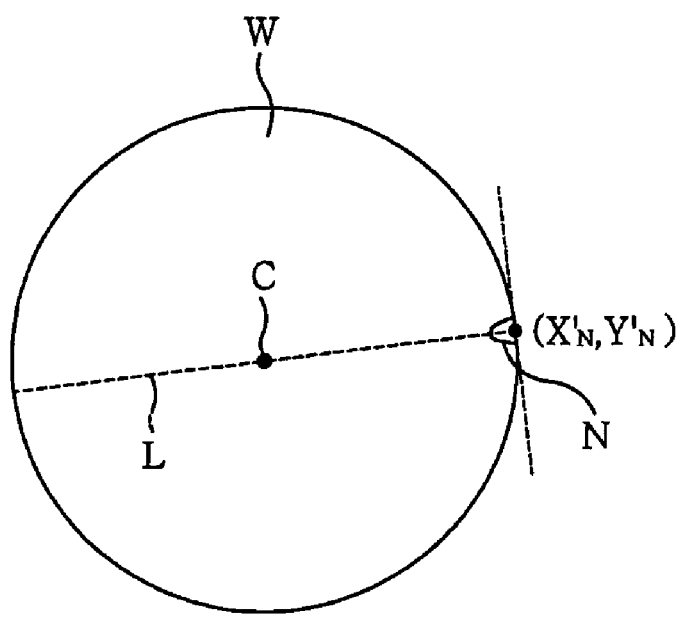

Therefore, a perpendicular line L (which corresponds to the line connecting the vertex KP and the intersection point $(X_N, Y_N)$ in FIG. 5C) is drawn to cross the intersection point $(X'_N, Y'_N)$ on the edge line on the captured image as depicted in FIG. 2B, and the position on the perpendicular line L spaced from the intersection point $(X'_N, Y'_N)$ by a radius of the wafer W is calculated as the center C $(X_C, Y_C)$ of the wafer W (step S9) to thereby terminate the detection of the center of the wafer W (step S10).

After the center of the wafer W is detected, the mounting table 11 rotates in the θ direction by the amount of rotation of the wafer W1 that has rotated to detect the center of the wafer W, so that the notch N precisely coincides with the direction obtained by the alignment of the wafer W. Since the center of the wafer W which is detected based on the notch N coincides with the center obtained by the alignment, the wafer W can be aligned with high precision.

As described above, the method of this embodiment which detects the center of a wafer is performed by the following steps of: capturing an image of the wafer W around the notch N by the first CCD camera 14; extracting the edge line E from the image of the wafer W; detecting the notch N from the edge line E; and calculating the center C of the wafer W based on the notch N. Therefore, the center of the wafer W can be detected only by moving once the mounting table 11 under the first CCD camera 14. As a consequence, the moving amount of the mounting table 11 decreases, so that time required for the alignment can be greatly reduced.

In accordance with this embodiment, the image of the wafer W1 rotates so that the vertex KP of the notch N can be directed upwards and, hence, the quadratic function approximation of the notch N can be easily performed. Further, in order to detect the notch N, the start point SP and the end point EP of the notch N are detected by performing the subtraction operations on the neighboring position data $D_n$ on the edge line E and, then, the vertex KP of the notch N is detected by performing the quadratic function approximation on the shape of the notch N. As a result, it is possible to obtain precise position data required to detect the center of the wafer W. Moreover, when the notch N is detected, the amount of rotation from the reference position of the wafer W can be detected based on inclined angles $M_1$, $M_2$ and $M_3$, wherein $M_1$ is a first inclined angle of a line segment connecting the start point SP and the vertex KP; $M_2$ is a second inclined angle of a line segment connecting the end point EP and the vertex; and $M_3$ is a third inclined angle of line segment connecting the start point SP and the end point EP. By correcting the amount of rotation, the notch N can coincide with the direction obtained by the alignment of the wafer W.

Besides, when the absolute value of the sum of the first and the second inclined angle $M_1$ and $M_2$ and the third inclined angle $M_3$ are respectively within the tolerance values, the intersection point $(X'_N, Y'_N)$ of the wafer W1 is calculated as an edge location of the wafer W, based on the intersection point $(X_N, Y_N)$ of the straight line, which connects the start point SP and the end point EP, and the perpendicular line, which is perpendicular to the straight line while crossing the vertex KP. Further, the location of the perpendicular line spaced from the edge location by a radius of the wafer is obtained as the center of the wafer. As a result, the center of the wafer can be precisely detected based on the major three points on the notch N and the wafer size.

Although the above embodiment has described the case of inspecting the wafer W, the method of the present invention which detects the center of a wafer can also be applied to the case of detecting the center of a wafer by using an imaging unit other than the inspection apparatus.

The present invention can be appropriately used when detecting the center of a wafer.

While the invention has been shown and described with respect to the embodiments, it will be understood by those skilled in the art that various changes and modification may be made without departing from the scope of the invention as defined in the following claims.

What is claimed is:

1. A method for detecting a center of a wafer having a notch when aligning the wafer mounted on a movable mounting table, comprising:
    capturing an image of the wafer by using an imaging unit, the image including the notch;
    extracting an edge line from the image of the wafer;
    detecting a shape of the notch from the edge line; and
    calculating a center of the wafer based on the shape of the notch,
    wherein the detecting the shape of the notch includes: detecting a start point and an end point of the notch based on slopes of tangents of the edge line; and calculating a vertex of the notch by performing a function approximation on the shape of the notch.

2. The method of claim 1, wherein the detecting the notch shape includes: calculating a first inclined angle of a line connecting the start point and the vertex; calculating a second inclined angle of a line connecting the end point and the vertex; and calculating a third inclined angle of a line connecting the start point and the end point.

3. The method of claim 2, further comprising:
    determining whether an absolute value of a sum of the first and the second inclined angle and the third inclined angle are respectively within threshold values.

4. The method of claim 3, wherein a first threshold value for the absolute value of the sum of the first and the second inclined angle is smaller than or equal to about 0.1° and a second threshold value for the third inclined angle is substantially 0°.

5. The method of claim 4, further comprising:
    rotating the image by a specific angle if at least one of the absolute value of the sum of the first and the second inclined angle and the third inclined angle is beyond the first and the second threshold value.

6. The method of claim 5, wherein the specific angle is about 0.1°.

7. The method of claim 5, wherein the specific angle is sequentially accumulated.

8. The method of claim 3, further comprising:
    if both of the absolute value of the sum of the first and the second inclined angle and the third inclined angle are within first and second threshold values, calculating as an edge position of the wafer, an intersection point between a straight line connecting the start point and the end point and a perpendicular line that is perpendicular to the straight line while crossing the vertex and calculating as the center of the wafer a position on the perpendicular line spaced from the edge position by a radius of the wafer.

9. The method of claim 1, further comprising:
    rotating the image so that the notch is positioned in a specific direction.

10. A non-transitory computer-readable storage medium storing a program that includes instructions which when executed by a computer causes the computer to perform a method of detecting a center of a wafer based on an image of the wafer displayed on a screen, the image being captured by an imaging unit when aligning the wafer mounted on a mounting table, the method comprising:
    capturing the image of the wafer by using the imaging unit, the image including a notch;
    extracting an edge line from the image of the wafer;
    detecting a shape of the notch from the edge line; and
    calculating the center of the wafer based on the shape of the notch,
    wherein the detecting the shape of the notch includes: detecting a start point and an end point of the notch based on slopes of tangents of the edge line; and calculating a vertex of the notch by performing a function approximation on the shape of the notch.

* * * * *